US012660118B2

(12) United States Patent
Kuan et al.

(10) Patent No.: US 12,660,118 B2
(45) Date of Patent: Jun. 16, 2026

(54) SERVER CABINET AND SERVER

(71) Applicant: Suzhou MetaBrain Intelligent Technology Co., Ltd., Suzhou (CN)

(72) Inventors: Chang Ming Kuan, Suzhou (CN); Chun Hsien Wu, Suzhou (CN)

(73) Assignee: Suzhou MetaBrain Intelligent Technology Co., Ltd., Suzhou (CN)

( * ) Notice: Subject to any disclaimer, the term of this patent is extended or adjusted under 35 U.S.C. 154(b) by 56 days.

(21) Appl. No.: 19/000,813

(22) Filed: Dec. 24, 2024

(65) Prior Publication Data

US 2025/0133680 A1     Apr. 24, 2025

Related U.S. Application Data

(63) Continuation of application No. PCT/CN2023/134088, filed on Nov. 24, 2023.

(30) Foreign Application Priority Data

Feb. 27, 2023     (CN) .......................... 202310167894.2

(51) Int. Cl.
*H05K 7/14* (2006.01)

(52) U.S. Cl.
CPC ................................... *H05K 7/1488* (2013.01)

(58) Field of Classification Search
CPC .. H05K 7/1489; H05K 7/1487; H05K 7/1488; H05K 5/30; Y02D 10/00;
(Continued)

(56) References Cited

U.S. PATENT DOCUMENTS

| 2008/0144296 A1* | 6/2008 | Chen ...................... G06F 1/185 361/759 |
| 2013/0107441 A1* | 5/2013 | Zhou ...................... G06F 1/185 248/298.1 |

(Continued)

FOREIGN PATENT DOCUMENTS

| CN | 111536388 A | 8/2020 |
| CN | 111625056 A | 9/2020 |

(Continued)

OTHER PUBLICATIONS

International Search Report PCT/CN2023/134088, mailed Feb. 13, 2024, 8 pages.

(Continued)

*Primary Examiner* — Allen L Parker
*Assistant Examiner* — Peter Krim
(74) *Attorney, Agent, or Firm* — Cooper Legal Group, LLC

(57) ABSTRACT

The present application relates to the technical field of servers. Provided are a server cabinet and a server. The server cabinet includes: a base; a hard disk frame arranged in the base, wherein the hard disk frame is provided with a first surface, which is provided with a first through hole; a first adjustment assembly, wherein the first adjustment assembly is provided with a first supporting leg, and the first supporting leg is located above the first through hole; a first moving plate, wherein the first moving plate is stacked above the first adjustment assembly and slide along the first adjustment assembly; In a condition that the first moving plate slides along the first adjustment assembly, the first moving plate can press the first adjustment assembly, such that the first supporting legs of the first adjustment assembly penetrate the first through hole to extend into the hard disk frame.

20 Claims, 7 Drawing Sheets

(58) Field of Classification Search

CPC . G06F 1/18; G06F 1/181; G06F 1/187; G11B 33/124; G11B 33/128

See application file for complete search history.

(56) References Cited

U.S. PATENT DOCUMENTS

| | | | |
|---|---|---|---|
| 2014/0293567 | A1 | 10/2014 | Kuo |
| 2015/0092338 | A1 | 4/2015 | Peng et al. |
| 2015/0382494 | A1 | 12/2015 | Hu |
| 2019/0237110 | A1 | 8/2019 | Ku et al. |
| 2020/0183466 | A1* | 6/2020 | Chen ........................ G06F 1/187 |
| 2022/0256726 | A1* | 8/2022 | Lu ......................... G11B 33/128 |
| 2022/0295659 | A1* | 9/2022 | Hsiao ................... H05K 7/1489 |
| 2024/0077349 | A1* | 3/2024 | Su ...................... H05K 7/20727 |

FOREIGN PATENT DOCUMENTS

| | | |
|---|---|---|
| CN | 211857391 U | 11/2020 |
| CN | 216154360 U | 4/2022 |
| CN | 216623125 U | 5/2022 |
| CN | 114610123 A | 6/2022 |
| CN | 216979702 U | 7/2022 |
| CN | 115686150 A | 2/2023 |
| CN | 115840495 A | 3/2023 |

OTHER PUBLICATIONS

Written Opinion PCT/CN2023/134088, mailed Feb. 13, 2024, 8 pages.

First Office Action CN202310167894.2, mailed Apr. 3, 2023, 8 pages.

Notification to Grant Patent Right for Invention CN202310167894.2, mailed Apr. 14, 2023, 3 pages.

* cited by examiner

SERVER CABINET AND SERVER

CROSS-REFERENCE TO RELATED APPLICATION

This application is a continuation of International Patent Application No. PCT/CN2023/134088, filed on Nov. 24, 2023, which claims priority to Chinese Patent Application No. 202310167894.2, filed with the China National Intellectual Property Administration on Feb. 27, 2023 and entitled "SERVER CABINET AND SERVER". International Patent Application No. PCT/CN2023/134088 and Chinese Patent Application No. 202310167894.2 are which is incorporated herein by reference in their entireties.

FIELD

The present application relates to the technical field of servers, in particular to a server cabinet and a server.

BACKGROUND

Nowadays, servers need to support hard disks of various sizes to meet diverse functionalities and increasing storage demands. In existing server cabinets, most of optical disk structures are fixed, allowing only hard disks of predetermined sizes to be installed. This limitation prevents a hard disk structure from meeting internal requirements of the server.

Currently, some designs employ an integrated hard disk structure that is detachably connected to the server cabinet. However, the integrated hard disk structure requires the purchase of additional modules for replacement. Furthermore, the server must be powered down during replacement, which impacts server uptime.

SUMMARY

The present application provides a server cabinet and a server, in order to overcome deficiencies in the prior art where a thickness of a hard disk structure may not be adjusted and may be only adaptable to a hard disk of a certain thickness.

The present application provides a server cabinet. The server cabinet includes: a base, wherein the base comprises a bottom plate; a hard disk frame arranged in the base, wherein the hard disk frame is provided with a first surface that faces away from the bottom plate, and a first through hole is formed in the first surface; a first adjustment assembly, wherein the first adjustment assembly is provided with a first supporting leg, and the first supporting leg is positioned above the first through hole; and a first moving plate, wherein the first moving plate is stacked above the first adjustment assembly and is capable of sliding along the first adjustment assembly; wherein the first moving plate presses the first adjustment assembly during sliding along the first adjustment assembly, and forces the first supporting leg of the first adjustment assembly to penetrate the first through hole and extend into the hard disk frame to reduce a height in the hard disk frame.

According to the server cabinet provided by the present application, the first adjustment assembly is provided with a pair of first supporting legs, a surface of the first moving plate that faces the first adjustment assembly is provided with a first boss, a surface of the first adjustment assembly that faces the first moving plate is provided with a second boss, the first boss is provided with a first inclined surface, the second boss is provided with a second inclined surface, and the first inclined surface and the second inclined surface slide in a matching manner; and the first boss has two positions: in a condition that the first boss is at a first position of the two positions, the first inclined surface of the first boss and the second inclined surface of the second boss are arranged opposite to each other, and in a condition that the first boss is at a second position of the two positions, the first boss and the second boss are stacked to press the first adjustment assembly.

According to the server cabinet provided by the present application, the first adjustment assembly includes: a first adjustment plate, wherein a first surface of the first adjustment plate that faces the hard disk frame is provided with the pair of the first supporting legs and a second surface of the first adjustment plate that faces the first moving plate is provided with the second boss; and a first elastic member, wherein the first elastic member is stacked above the first surface of the hard disk frame and positioned between the pair of the first supporting legs; wherein in the condition that the first boss is at the first position, the first elastic member is in a first compressed state, and in the condition that the first boss is at the second position, the first elastic member is in a second compressed state. According to the server cabinet provided by the present application, the first adjustment assembly includes a first adjustment plate, wherein a first surface of the first adjustment plate that faces the hard disk frame is provided with the pair of the first supporting legs and a second surface of the first adjustment plate that faces the first moving plate is provided with the second boss; and the first through hole is cross-shaped hole.

The server cabinet provided by the present application further includes: a second adjustment assembly, wherein the second adjustment assembly is provided with a pair of second supporting legs, the hard disk frame is further provided with a second surface, the second surface of the hard disk frame is opposite to the first surface of the hard disk frame, a pair of second through holes are formed in the second surface of the hard disk frame, and each of the second supporting legs is positioned below one of the second through holes; and a second moving plate, wherein the second moving plate is stacked below the second adjustment assembly, is in contact with the bottom plate of the base, and is capable of sliding along the second adjustment assembly; wherein the second moving plate presses the second adjustment assembly during sliding along the second adjustment assembly, and forces the second supporting legs of the second adjustment assembly to penetrate the second through holes and extend into the hard disk frame to reduce the effective height in the hard disk frame.

According to the server cabinet provided by the present application, a first surface of the second moving plate that faces the second adjustment assembly is provided with a third boss, a second surface of the second adjustment assembly that faces the second moving plate is provided with a fourth boss, the third boss is provided with a third inclined surface, the fourth boss is provided with a fourth inclined surface, and the third inclined surface and the fourth inclined surface slide in a matching manner; and the third boss has two positions: in a condition that the third boss is at a third position of the two positions, the third inclined surface of the third boss and the fourth inclined surface of the fourth boss are arranged opposite to each other, and in a condition that the third boss is at a fourth position of the two positions, the third boss and the fourth boss are stacked to press the second adjustment assembly.

According to the server cabinet provided by the present application, the second adjustment assembly includes: a second adjustment plate, wherein a first surface of the second adjustment plate that faces the hard disk frame is provided with the pair of second supporting legs and a second surface of the second adjustment plate that faces the second moving plate is provided with the fourth boss; and a second elastic member, wherein the second elastic member is stacked below the second surface of the hard disk frame and positioned between the pair of second supporting legs; wherein in the condition that the third boss is at the third position, the second elastic member is in a first compressed state, and in the condition that the third boss is at the fourth position, the second elastic member is in a second compressed state.

According to the server cabinet provided by the present application, the second adjustment assembly includes a second adjustment plate, wherein a first surface of the second adjustment plate that faces the hard disk frame is provided with the pair of second supporting legs and a second surface of the second adjustment plate that faces the second moving plate is provided with the fourth boss; and the second through holes are cross-shaped holes.

According to the server cabinet provided by the present application, the first moving plate and the first adjustment assembly form a first adjustment mechanism; the second moving plate and the second adjustment assembly form a second adjustment mechanism; multiple first adjustment mechanisms and multiple second adjustment mechanisms are arranged, and each of the multiple first adjustment mechanisms is positioned opposite to one of the multiple second adjustment mechanisms.

According to the server cabinet provided by the present application, each of at least one of the multiple first adjustment mechanisms or the multiple second adjustment mechanisms is configured to adjust a height of a relative position in the hard disk frame.

The server cabinet provided by the present application further includes: a cover plate, wherein the cover plate is stacked above the first moving plate and connected to two side plates of the base; and a first transfer switch which is arranged on an end face of the cover plate, is connected to the cover plate in a sliding way, and is connected to the first moving plate.

According to the server cabinet provided by the present application, the end face of the cover plate is provided with a first groove, a second groove, and a third groove, wherein the first groove, the second groove, and the third groove are arranged in parallel; and the first transfer switch is provided with a first surface of the first transfer switch, wherein a first end of the first surface of the first transfer switch is provided with a first protrusion and a second end of the first surface of the first transfer switch is provided with a second protrusion; the first protrusion is arranged in the first groove, is capable of sliding along the first groove, and is connected to the first moving plate; and the second protrusion is connected to the second groove or the third groove in a clamping manner.

According to the server cabinet provided by the present application, the first transfer switch is further provided with a second surface, wherein the second surface of the first transfer switch is opposite to the first surface of the first transfer switch; the second surface of the first transfer switch is provided with a third protrusion; the third protrusion is arranged opposite to the second protrusion; and in a condition that the third protrusion is pressed, the second protrusion is separated from the second groove or the third groove.

The server cabinet provided by the present application further includes a second transfer switch which is arranged on an end face of the hard disk frame, is connected to the hard disk frame in a sliding way, and is connected to the second moving plate.

According to the server cabinet provided by the present application, the end face of the hard disk frame is provided with a fourth groove, a fifth groove, and a sixth groove, wherein the fourth groove, the fifth groove, and the sixth groove are arranged in parallel; and the second transfer switch is provided with a first surface, wherein a first end of the first surface of the second transfer switch is provided with a fourth protrusion and a second end of the first surface of the second transfer switch is provided with a fifth protrusion; the fourth protrusion is arranged in the fourth groove, is capable of sliding along the fourth groove, and is connected to the second moving plate; and the fifth protrusion is connected to the fifth groove or the sixth groove in a clamping manner. According to the server cabinet provided by the present application, the second transfer switch is further provided with a second surface, wherein the second surface of the second transfer switch is opposite to the first surface of the second transfer switch; the second surface of the second transfer switch is provided with a sixth protrusion; the sixth protrusion is arranged opposite to the fifth protrusion; and in a condition that the sixth protrusion is pressed, the fifth protrusion is separated from the fifth groove or the sixth groove.

The present application further provides a server, which includes the server cabinet.

The present application provides a server cabinet. The server cabinet includes: a base, wherein the base comprises a bottom plate and two side plates arranged on two sides of the bottom plate; a hard disk frame arranged in the base, wherein the hard disk frame is provided with a first surface that faces away from the bottom plate, and a pair of first through holes are formed in the first surface; a first adjustment assembly, wherein the first adjustment assembly is provided with a pair of first supporting legs, and each of the first supporting legs is positioned above one of the first through holes; a first moving plate, wherein the first moving plate is stacked above the first adjustment assembly and is capable of sliding along the first adjustment assembly; and a cover plate, wherein the cover plate is stacked above the first moving plate and connected to the two side plates of the base; wherein the first moving plate presses the first adjustment assembly during sliding along the first adjustment assembly, and forces the first supporting legs of the first adjustment assembly to penetrate the first through holes and extend into the hard disk frame to reduce a height in the hard disk frame.

According to the server cabinet provided by the present application, the first moving plate and the first adjustment assembly are arranged, and the first through hole is formed in the first surface of the hard disk frame. In a condition that the first moving plate is stationary, a height in the hard disk frame remains at an original height, and thus a hard disk of a certain thickness may be arranged. During moving, the first moving plate presses the first adjustment assembly and then forces the first supporting legs to extend into the hard disk frame to reduce a height in the hard disk frame and allow for installation of thinner hard disks. Therefore, hard disks of different thicknesses may be installed in the server cabinet, and applicability of the server cabinet is improved accordingly.

BRIEF DESCRIPTION OF THE DRAWINGS

In order to describe the technical solutions in the embodiments of the present application or the prior art more clearly, the drawings required to be used in descriptions about the embodiments or the prior art will be simply introduced below. It is apparent that the drawings described below are only some embodiments of the present application. Other drawings may further be obtained by those of ordinary skill in the art according to these drawings without creative work.

REFERENCE NUMERALS

Figure 1:
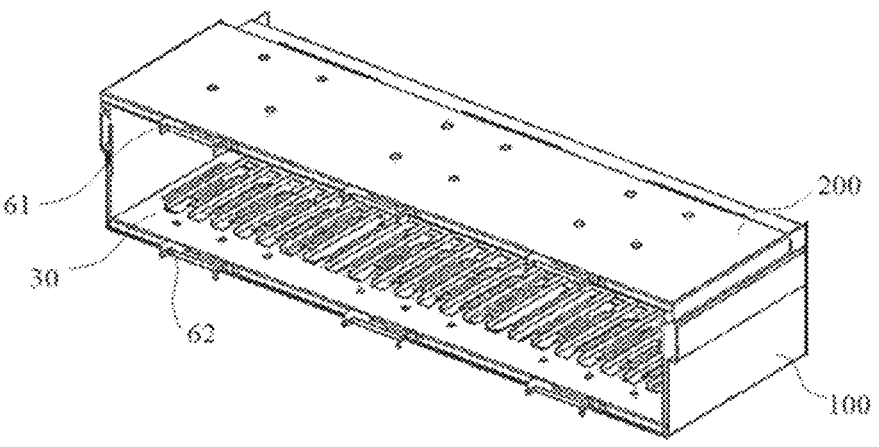
FIG. 1 is a schematic diagram of an overall structure of a server cabinet according to the present application.

10: first moving plate; 11: first boss; 21: first adjustment plate; 22: first elastic member; 30: hard disk frame; 31: first surface; 32: first through hole; 33: second surface; 34: second through hole; 35: fourth groove; 36: fifth groove; 37: sixth groove; 40: second moving plate; 41: third boss; 51: second adjustment plate; 52: second elastic member; 61: first transfer switch; 62: second transfer switch; 621: fourth protrusion; 622: fifth protrusion; 623: sixth protrusion; 100: base; 110: bottom plate; 120: side plate; 200: cover plate; 201: first groove; 202: second groove; 203: third groove; 211:

second boss; 212: first supporting leg; 511: fourth boss; 512: second supporting leg; 611: first protrusion; 612: second protrusion; 613: third protrusion; D: height and H: height.

DETAILED DESCRIPTION

In order to describe the objectives, technical solutions, and advantages of the present application more clearly, the technical solutions in the present application will be clearly and completely described below in combination with the drawings in the present application. It is apparent that the described embodiments are not all embodiments but part of embodiments of the present application. All other embodiments obtained by those of ordinary skill in the art on the basis of the embodiments in the application without creative work shall fall within the scope of protection of the present application.

A feature defined by "first" or "second" in the specification and claims of the present application may explicitly or implicitly indicate inclusion of one or more such features. In addition, in the descriptions of the present application, "multiple" means two or more, unless otherwise specified.

In the descriptions of the present application, it is to be understood that orientation or position relationships indicated by terms "center", "longitudinal", "transverse", "length", "width", "thickness", "upper", "lower", "front", "back", "left", "right", "vertical", "horizontal", "top", "bottom", "inner", "outer", and the like are orientation or position relationships shown in the drawings, are adopted not to indicate or imply that indicated devices or components must be in specific orientations or structured and operated in specific orientations but only to conveniently describe the present application and simplify descriptions. Therefore, it may not be construed as a limitation to the present application.

In the descriptions of the present application, it is to be noted that, unless otherwise definitely specified and limited, terms "arrange", "mount", "link", and "connect" should be broadly understood. For example, the terms may refer to fixed connection and may also refer to detachable connection or integrated connection. The terms may refer to mechanical connection and may also refer to electrical connection. The terms may refer to direct connection, may also refer to indirect connection through a medium, and may refer to communication in two components. For those of ordinary skill in the art, specific meanings of these terms in the present application can be understood according to a specific condition.

A server cabinet and a server of the present application are described below with reference to FIG. 1 to FIG. 19.

Figure 2:
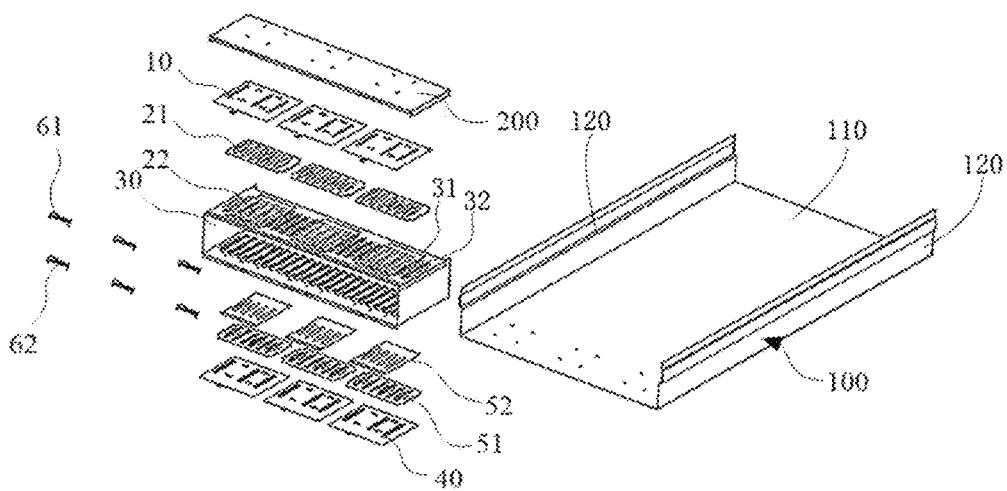
FIG. 2 is an explosive view of a server cabinet according to the present application.

As shown in FIG. 1 and FIG. 2, in some embodiments of the present application, the server cabinet includes a base 100, a first moving plate 10, a first adjustment assembly, a hard disk frame 30, and a cover plate 200. The base 100 includes a bottom plate 110 and two side plates 120 arranged on two sides of the bottom plate 110. The hard disk frame 30 is arranged in the base 100 and is provided with a first surface 31 that faces away from the bottom plate 110, and a pair of first through holes 32 are formed in the first surface 31 of the hard disk frame 30. The first adjustment assembly is provided with a pair of first supporting legs 212, and each of the first supporting legs 212 is positioned above one of the first through holes. The first moving plate 10 is stacked above the first adjustment assembly and can slide along the first adjustment assembly. The cover plate 200 is stacked above the first moving plate 10 and connected to the two side plates of the base 100. When sliding along the first adjustment assembly, the first moving plate 10 presses the first adjustment assembly, and forces the first supporting legs 212 of the first adjustment assembly to penetrate the first through holes and extend into the hard disk frame 30 to reduce a height H in the hard disk frame 30. The number of the first through hole 32 may be one, two, or more.

In some embodiments, the base 100 includes the bottom plate 110 and the two side plates 120 arranged on the two sides of the bottom plate 110. The bottom plate 110 and the two side plates form a U-shaped slot structure. The hard disk frame 30, the first adjustment assembly, and the first moving plate 10 are stacked in the U-shaped slot structure. The cover plate 200 is stacked above the first moving plate 10 and connected to the two side plates of the base 100. The first moving plate 10 is pushed from the front of the base 100 to slide along the first adjustment assembly, the first moving plate 10 can apply a pressing force to the first adjustment assembly, whereby the first supporting legs 212 of the first adjustment assembly penetrate the first through holes and extend into the hard disk frame 30 to reduce the height H in the hard disk frame 30 and allow for installation of thinner hard disks.

Further, in some embodiments, when the first moving plate 10 is stationary, the first supporting legs 212 of the first adjustment assembly are positioned above the first through holes 32 of the hard disk frame 30. In some embodiments, the first adjustment assembly may be provided with an elastic member, and the elastic member is arranged on the first surface 31 of the hard disk frame 30 and is positioned between the pair of first supporting legs 212 of the first adjustment assembly. When the first moving plate 10 does not apply a force to the first adjustment assembly, the elastic member supports the first adjustment assembly, thereby preventing the first supporting legs 212 from penetrating the first through holes. When the first moving plate 10 applies a force to the first adjustment assembly, the elastic member is compressed, and the first supporting legs 212 penetrate the first through holes 32 and extend into the hard disk frame 30.

In another embodiment of the present application, cross-shaped holes are formed in the first surface 31 of the hard disk frame 30 and serve as the first through holes. When the first moving plate 10 does not apply a force to the first adjustment assembly, the cross-shaped holes support the first adjustment assembly. When the first moving plate 10 applies a force to the first adjustment assembly, the cross-shaped holes are insufficient to support the first adjustment assembly, and the first supporting legs 212 of the first adjustment assembly penetrate the cross-shaped holes and extend into the hard disk frame 30 to reduce the height H in the hard disk frame 30.

Further, in some embodiments, the first moving plate 10 may be provided with a first boss 11, and the first adjustment assembly may be provided with a second boss 211. When the first moving plate 10 is stationary, the first boss 11 and the second boss 211 are arranged opposite to each other laterally, and at this point, the first moving plate 10 does not apply a force to the first adjustment assembly. When the first moving plate 10 moves, the first boss 11 moves toward the second boss 211 and finally slides over the second boss 211. Finally, the first moving plate 10 presses the first adjustment assembly, and forces the first supporting legs 212 of the first adjustment assembly to penetrate the first through holes and extend into the hard disk frame 30.

According to the server cabinet provided by some embodiments of the present application, the first moving plate and the first adjustment assembly are arranged, and the first through holes are formed in the first surface of the hard disk frame. When the first moving plate is stationary, a height H in the hard disk frame remains at an original height, and a hard disk of a certain thickness may be arranged. When moving, the first moving plate presses the first adjustment assembly and then forces the first supporting legs to extend into the hard disk frame to reduce the height H in the hard disk frame and allowing for installation of thinner hard disks. Therefore, hard disks of different thicknesses may be installed in the server cabinet, and applicability of the server cabinet is improved accordingly.

Figure 3:
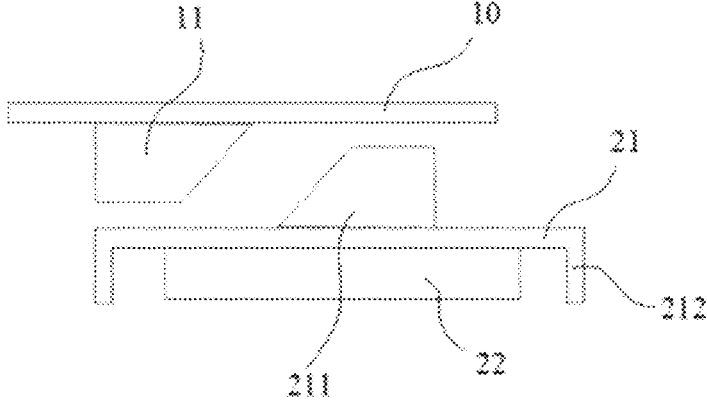
FIG. 3 is a schematic structural diagram of a part of a server cabinet when a first boss at a first position according to the present application.
Figure 4:
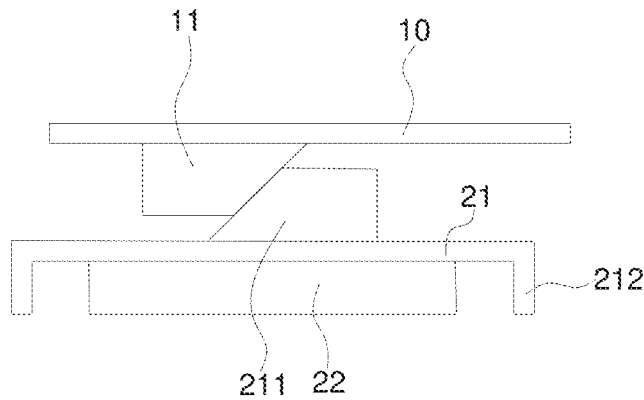
FIG. 4 is a schematic structural diagram of a part of a server cabinet when a first boss at a position according to the present application.
Figure 5:
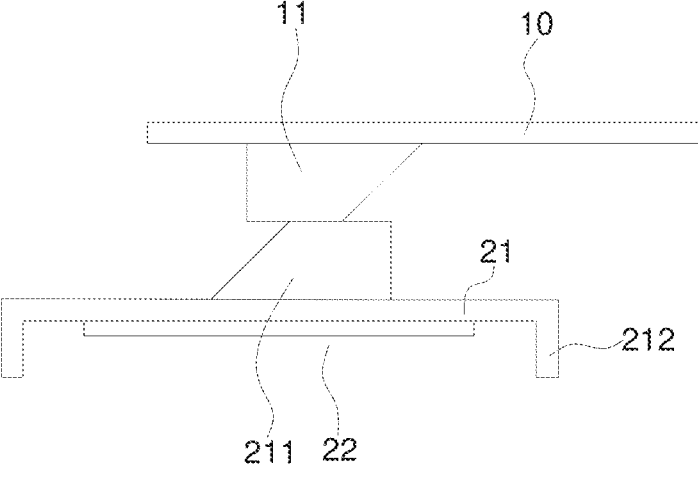
FIG. 5 is a schematic structural diagram of a part of a server cabinet when a first boss at a second position according to the present application.

As shown in FIG. 3 to FIG. 5, in some embodiments of the present application, a first surface of the first moving plate 10 that faces the first adjustment assembly is provided with the first boss 11, a second surface of the first adjustment assembly that faces the first moving plate 10 is provided with the second boss 211, the first boss 11 is provided with a first inclined surface, the second boss 211 is provided with a second inclined surface, and the first inclined surface and the second inclined surface slide in a matching manner. The first boss 11 has two positions: when the first boss 11 is at a first position of the two positions, the first inclined surface of the first boss 11 and the second inclined surface of the second boss 211 are arranged opposite to each other, as shown in FIG. 3, and when the first boss 11 is at a second position of the two positions, the first boss 11 and the second boss 211 are stacked to press the first adjustment assembly, as shown in FIG. 5.

As shown in FIG. 4, when the first moving plate 10 is stationary, the first inclined surface of the first boss 11 and the second inclined surface of the second boss 211 are arranged opposite to each other, and the first moving plate 10 is rested on the second boss 211. At this point, the first moving plate 10 does not apply a force to the first adjustment assembly, and the first supporting legs 212 of the first adjustment assembly are positioned above the first through holes. As shown in FIG. 5, when the first moving plate 10 moves, the first inclined surface of the first boss 11 is abut against the second inclined surface of the second boss 211. The first inclined surface of the first boss 11 and the second inclined surface of the second boss 211 slide in a matching manner to force the first boss 11 to slide onto a top surface of the second boss 211. At this point, the first boss 11 applies a pressing force to the second boss 211. Therefore, the first supporting legs 212 of the first adjustment assembly penetrate the first through holes 32 and extend into the hard disk frame 30 to reduce the height H in the hard disk frame 30.

In some embodiments, the first inclined surface of the first boss 11 and the second inclined surface of the second boss 211 are arranged opposite to each other, as shown in FIG. 3. Then, when the first moving plate 10 moves, the first inclined surface of the first boss 11 gets close to the second inclined surface of the second boss 211 and the first moving plate 10 is rested on the second boss 211, as shown in FIG. 4. Then, as the first moving plate 10 continues to move, the first inclined surface of the first boss 11 is abutted against the second inclined surface of the second boss 211. The first inclined surface of the first boss 11 and the second inclined surface of the second boss 211 slide in a matching manner to force the first boss 11 to slide onto a top surface of the second boss 211, as shown in FIG. 5. At this point, the first boss 11 applies a pressing force to the second boss 211.

In some embodiments of the present application, the first adjustment assembly includes a first adjustment plate 21 and a first elastic member 22. A first surface of the first adjustment plate 21 that faces the hard disk frame 30 is provided with the pair of first supporting legs 212 and a second surface of the first adjustment plate 21 that faces the first moving plate 10 is provided with the second boss 211. The first elastic member 22 is stacked above the first surface 31 of the hard disk frame 30 and is positioned between the pair of first supporting legs 212. When the first boss 11 is at the first position, the first elastic member 22 is in a first compressed state; and when the first boss 11 is at the second position, the first elastic member 22 is in a second compressed state. The height D of the first elastic member 22 in the first compressed state is higher than its height D in the second compressed state.

Figure 16:
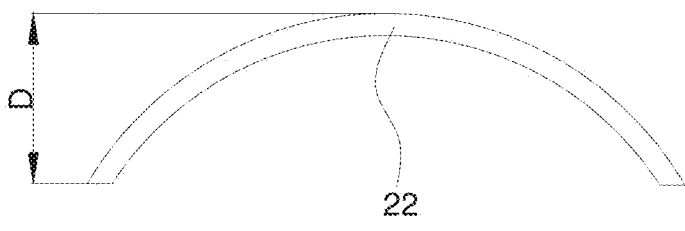
FIG. 16 is a schematic structural diagram of the first elastic member 22 which is in its natural state according to the present application.
Figure 17:
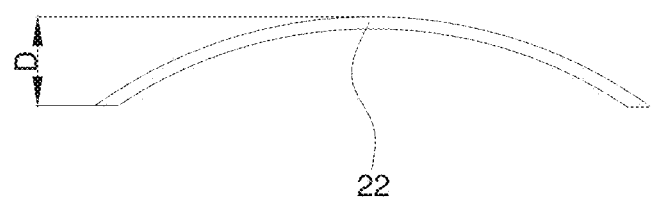
FIG. 17 is a schematic structural diagram of the first elastic member 22 which is in its first compressed state according to the present application.
Figure 18:
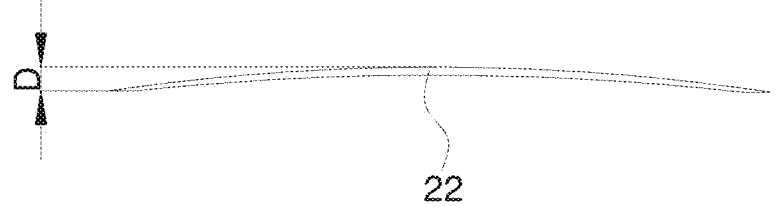
FIG. 18 is a schematic structural diagram of the first elastic member 22 which is in its second compressed state according to the present application.

In some embodiments, When the first elastic member 22 is in its natural state, the first elastic member 22 is unaffected by external forces and its height D is 3-5 mm, as shown in FIG. 16. When the first elastic member 22 is in the first compressed state, its height D is 1.7 mm, as shown in FIG. 17. When the first elastic member 22 is in the second compressed state, its height D is 0.3 mm, as shown in FIG. 18.

Figure 15:
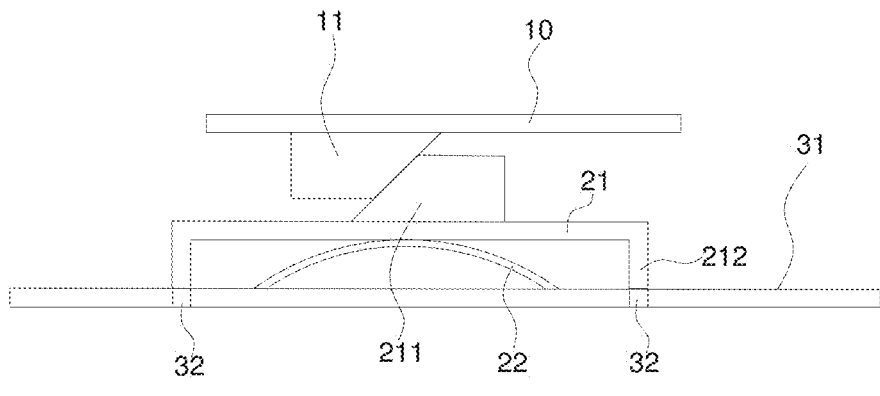
FIG. 15 is a schematic structural diagram of a part of a server cabinet according to the present application.

In some embodiments, the first elastic member 22 is a platelet structure that is elastic. The two ends of the first elastic member 22 are fixed on the first surface 31 of the hard disk frame 30, and the middle part of the first elastic member 22 is arching upwards to support the first adjustment plate 21, as shown in FIG. 15. In some embodiments, the first elastic member 22 is a spring. The first elastic member 22 may have several variants.

The first elastic member 22 is positioned between the pair of first supporting legs 212 of the first adjustment plate 21. When the first moving plate 10 is stationary, the first inclined surface of the first boss 11 and the second inclined surface of the second boss 211 are arranged opposite to each other, and the first elastic member 22 is in a first compressed state. The first elastic member 22 provides a supporting force for the first adjustment plate 21, thereby keeping the pair of first supporting legs 212 of the first adjustment plate 21 above the first through holes. Upon movement of the first moving plate 10, when the first boss 11 slides over the second boss 211, the first boss 11 presses the first adjustment plate 21, and then the first adjustment plate 21 presses the first elastic member 22 positioned below the first adjustment plate 21. Consequently, the first elastic member 22 is in a second compressed state, and at this point, the pair of first supporting legs 212 of the first adjustment plate 21 penetrate the first through holes 32 and extend into the hard disk frame 30 to reduce the height H in the hard disk frame 30.

In some embodiments of the present application, the first adjustment assembly includes a first adjustment plate 21. A first surface of the first adjustment plate 21 that faces the hard disk frame 30 is provided with the pair of first supporting legs 212 and a second surface of the first adjustment plate 21 that faces the first moving plate 10 is provided with the second boss 211, and the first through holes are cross-shaped holes.

When the first moving plate 10 does not apply a force to the first adjustment plate 21, the cross-shaped holes can support the first adjustment plate 21. When the first moving plate 10 applies a force to the first adjustment plate 21, the cross-shaped holes are insufficient to support the first adjustment plate 21, and the first supporting legs 212 of the first adjustment plate 21 penetrate the cross-shaped holes and extend into the hard disk frame 30 to reduce the height H in the hard disk frame 30.

Correspondingly, in some embodiments of the present application, a second adjustment assembly and a second moving plate 40 may also be arranged on the other side of the hard disk frame 30. When extending into the hard disk frame 30, second supporting legs 512 of the second adjustment assembly can cooperate with the first supporting legs 212 to further reduce the height H in the hard disk frame 30 and allow for installation of thinner hard disks in the hard disk frame 30.

The server cabinet further includes a second adjustment assembly and a second moving plate 40. The second adjustment assembly is provided with a pair of second supporting legs 512. The hard disk frame 30 is further provided with a second surface 33, which is opposite to the first surface 31 of the hard disk frame 30. A pair of second through holes 34 are formed in the second surface 33 of the hard disk frame 30, and each of the second supporting legs 512 is positioned below one of the second through holes 34. The second moving plate 40 is stacked below the second adjustment assembly and is in contact with the bottom plate 110 of the base 100. The second moving plate 40 can slide along the second adjustment assembly. When sliding along the second adjustment assembly, the second moving plate 40 presses the second adjustment assembly and forces the second supporting legs 512 of the second adjustment assembly to penetrate the second through holes 34 and extend into the hard disk frame 30 to reduce the height H in the hard disk frame 30.

In some embodiments, the second moving plate 40 is positioned above the bottom plate 110 of the base 100, and the second adjustment assembly is stacked above the second moving plate and is in contact with the second surface of the hard disk frame 30, namely, the second adjustment assembly and the second moving plate 40 are positioned below the hard disk frame 30. When the second moving plate 40 is stationary, the second supporting legs 512 of the second adjustment assembly are positioned below the second through holes 34 and do not extend into the hard disk frame 30. After the second moving plate 40 moves, the second moving plate 40 presses the second adjustment assembly, and forces the second supporting legs 512 to penetrate the second through holes 34 and extend into the hard disk frame 30. A space between the first supporting legs 212 and the second supporting legs 512 forms an installation space for the hard disk, thereby allowing for installation of further thinner hard disks.

According to the server cabinet provided by some embodiments of the present application, the first moving plate, the first adjustment assembly, the second moving plate, and the second adjustment assembly are arranged, which allow the first supporting legs and the second supporting legs to extend from two opposite surfaces of the hard disk frame into the hard disk frame, thereby further reducing the height in the hard disk frame, allowing for installation of further thinner hard disks in the hard disk frame, and enhancing the applicability of the server cabinet.

Further, in some embodiments of the present application, a first surface of the second moving plate 40 that faces the second adjustment assembly is provided with a third boss 41, a second surface of the second adjustment assembly that faces the second moving plate 40 is provided with a fourth boss 511, the third boss 41 is provided with a third inclined surface, the fourth boss 511 is provided with a fourth inclined surface, and the third inclined surface and the fourth inclined surface slide in a matching manner. The third boss 41 has two positions: when the third boss 41 is at a third position of the two positions, the third inclined surface of the third boss 41 and the fourth inclined surface of the fourth boss 511 are arranged opposite to each other, and when the third boss 41 is at a fourth position of the two positions, the third boss 41 and the fourth boss 511 are stacked to press the second adjustment assembly.

Figure 6:
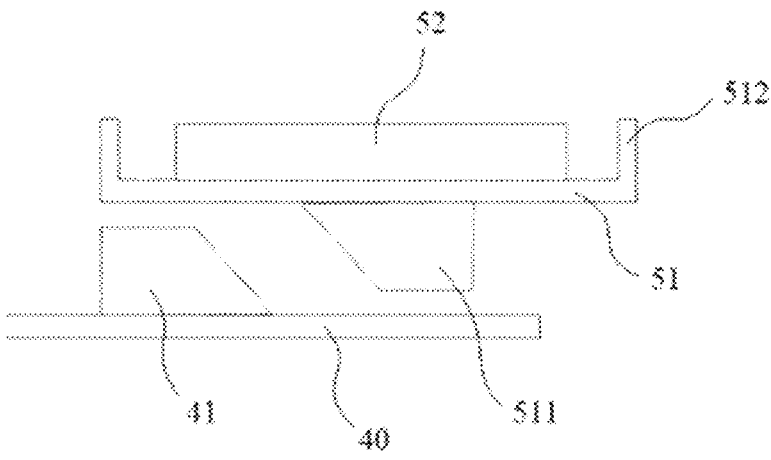
FIG. 6 is a schematic structural diagram of a part of a server cabinet when a third boss at a third position according to the present application.
Figure 8:
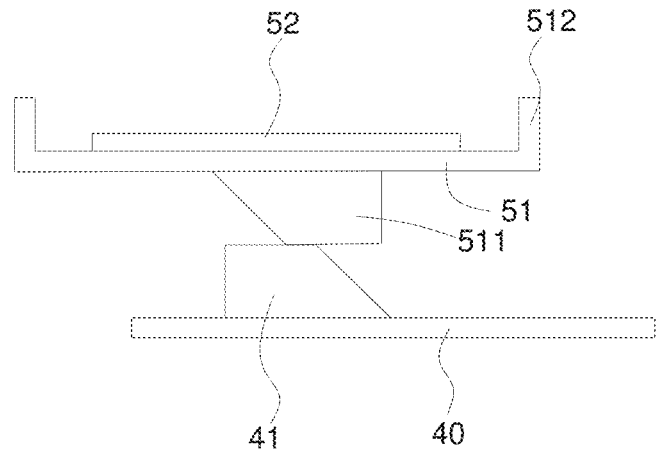
FIG. 8 is a schematic structural diagram of a part of a server cabinet when a third boss at a fourth position according to the present application.

As shown in FIG. 6, when the second moving plate 40 is stationary, the third inclined surface of the third boss 41 and the fourth inclined surface of the fourth boss 511 are arranged opposite to each other, and the second moving plate 40 is rested on the fourth boss 511. At this point, the second moving plate 40 does not apply a force to the second adjustment assembly, and the second supporting legs 512 of the second adjustment assembly are positioned below the second through holes. As shown in FIG. 8, when the second moving plate 40 moves, the third inclined surface of the third boss 41 is abut against the fourth inclined surface of the fourth boss 511. The third inclined surface of the third boss 41 and the fourth inclined surface of the fourth boss 511 slide in a matching manner to force the third boss 41 to slide onto a bottom surface of the fourth boss 511. At this point, the third boss 41 applies a pressing force to the fourth boss 511. Therefore, the second supporting legs 512 of the second adjustment assembly penetrate the second through holes 34 and extend into the hard disk frame 30 to reduce the height H in the hard disk frame 30.

Figure 7:
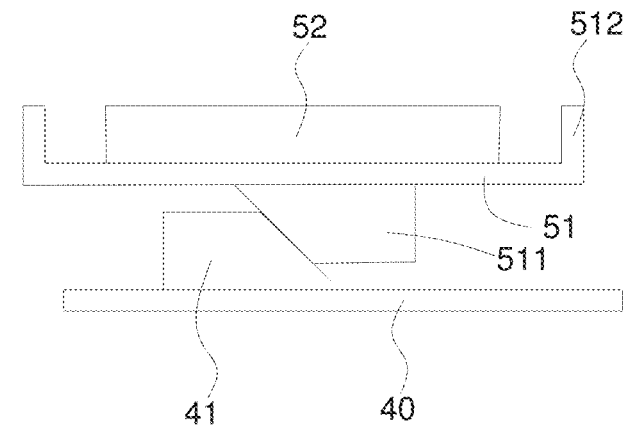
FIG. 7 is a schematic structural diagram of a part of a server cabinet when a third boss at a position according to the present application.

As shown in FIG. 6 to FIG. 8, in some embodiments of the present application, the second adjustment assembly includes a second adjustment plate 51 and a second elastic member 52. The first surface of the second adjustment plate 51 that faces the hard disk frame 30 is provided with the pair of second supporting legs 512 and the second surface of the second adjustment plate 51 that faces the second moving plate 40 is provided with the fourth boss 511. The second elastic member 52 is stacked below the second surface of the hard disk frame 30 and positioned between the pair of second supporting legs 512. When the third boss 41 is at the third position, the second elastic member 52 is in a first compressed state, and when the third boss 41 is at the fourth position, the second elastic member 52 is in a second compressed state. The height of the second elastic member 52 in the first compressed state is higher than its height in the second compressed state.

In some embodiments, When the second elastic member 52 is in its natural state, the second elastic member is unaffected by external forces and its height is 3-5 mm. When the second elastic member 52 is in the first compressed state, its height is 1.7 mm. When the second elastic member 52 is in the second compressed state, its height is 0.3 mm. In some embodiments, the second elastic member 52 and the first elastic member 22 may be metal elastic sheet.

Figure 19:
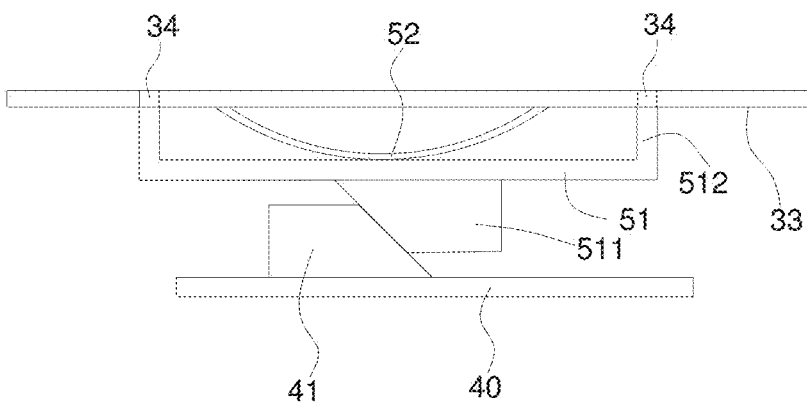
FIG. 19 is a schematic structural diagram of a part of a server cabinet according to the present application.

In some embodiments, the second elastic member 52 is a platelet structure that is elastic. The two ends of the second elastic member 52 are fixed on the second surface 33 of the hard disk frame 30, and the middle part of the second elastic member 52 is arching downwards to press the second adjustment plate 51, as shown in FIG. 19. In some embodiments, the second elastic member 52 is a spring. The second elastic member 52 may have several variants.

The second elastic member 52 is positioned between the pair of second supporting legs 512 of the second adjustment plate 51. When the second moving plate 40 is stationary, the third boss 41 and the fourth boss 511 are arranged opposite to each other, and the second elastic member 52 is in a first compressed state. The second elastic member 52 jacks up the second adjustment plate 51, thereby keeping the pair of second supporting legs 512 of the second adjustment plate 51 below the second through holes. Upon movement of the second moving plate 40, when the third boss 41 slides to the bottom of the fourth boss 511, the third boss 41 presses the second adjustment plate 51, and then the second adjustment plate 51 presses the second elastic member 52 positioned above the second adjustment plate 51. Consequently, the second elastic member 52 is in a second compressed state, and at this point, the pair of second supporting legs 512 of the second adjustment plate 51 penetrate the second through holes and extend into the hard disk frame 30 to reduce the height H in the hard disk frame 30.

In some embodiments, the third inclined surface of the third boss 41 and the fourth inclined surface of the fourth boss 511 are arranged opposite to each other, as shown in FIG. 6. Then, when the second moving plate 40 moves, the third boss 41 gets close to the second adjustment plate 51 and the third boss 41 abuts against the fourth boss 511, as shown in FIG. 7. Then, as the second moving plate 40 continues to move, the third boss 41 slides to the bottom of the fourth boss 511, and the third boss 41 presses the second adjustment plate 51. At this point, the second adjustment plate 51 presses the second elastic member 52 positioned above the second adjustment plate 51, as shown in FIG. 8.

In some embodiments of the present application, the second adjustment assembly includes a second adjustment plate 51. A first surface of the second adjustment plate 51 that faces the hard disk frame 30 is provided with the pair of second supporting legs 512 and a second surface of the second adjustment plate 51 that faces the second moving plate 40 is provided with the fourth boss 511; and the second through holes are cross-shaped holes.

When the second moving plate 40 does not apply a force to the second adjustment plate 51, the cross-shaped holes can support the second adjustment plate 51. When the second moving plate 40 applies a force to the second adjustment plate 51, the cross-shaped holes are insufficient to support the second adjustment plate 51, and the second supporting legs 512 of the second adjustment plate 51 penetrate the cross-shaped holes and extend into the hard disk frame 30 to reduce the height H in the hard disk frame 30.

In some embodiments of the present application, the first moving plate 10 and the first adjustment assembly form a first adjustment mechanism; the second moving plate 40 and the second adjustment assembly form a second adjustment mechanism; and multiple first adjustment mechanisms and multiple second adjustment mechanisms are arranged, and each of the multiple first adjustment mechanisms is positioned opposite to one of the multiple second adjustment mechanisms.

The multiple first adjustment mechanisms may be arranged above the hard disk frame 30, while the multiple second adjustment mechanisms may be arranged below the hard disk frame 30. Each of at least one of the multiple first adjustment mechanisms and/or the multiple second adjustment mechanisms can adjust a height H of a relative position in the hard disk frame 30, thereby allowing hard disks of different thicknesses to be installed in the hard disk frame 30 simultaneously. For example, if three first adjustment mechanisms and three second adjustment mechanisms are arranged, the three first adjustment mechanisms and three second adjustment mechanisms may divide an internal space of the hard disk frame 30 into three regions with different heights. If a first pair of first adjustment mechanism and second adjustment mechanism remain stationary, a height H of a space in the hard disk frame 30 is maximum, and thicker hard disks may be installed. If one of a second pair of first adjustment mechanism and second adjustment mechanism moves, the first supporting legs 212 of the first adjustment mechanism or the second supporting legs 512 of the second adjustment mechanism extend into the hard disk frame 30 to reduce the height H in the hard disk frame 30, and therefore thinner hard disks may be installed in the hard disk frame 30.

If the first supporting legs 212 of the first adjustment mechanism and the second supporting legs 512 of the second adjustment mechanism that belong to a third pair both extend into the hard disk frame 30, the height H in the hard disk frame 30 is further reduced, whereby further thinner hard disks may be installed.

As shown in FIG. 1, in some embodiments of the present application, the server cabinet further includes a first transfer switch 61. The first transfer switch 61 is arranged on an end face of the cover plate 200. The first transfer switch 61 is connected to the cover plate 200 in a sliding way and is connected to the first moving plate 10.

The first transfer switch 61 is arranged on the end surface of the cover plate 200 and is connected to the first moving plate 10. When the first transfer switch 61 is pushed to slide along the cover plate 200, the first moving plate 10 is driven to move, and then presses the first adjustment plate 21 to force the pair of first supporting legs 212 of the first adjustment plate 21 to extend into the hard disk frame 30.

Figure 9:
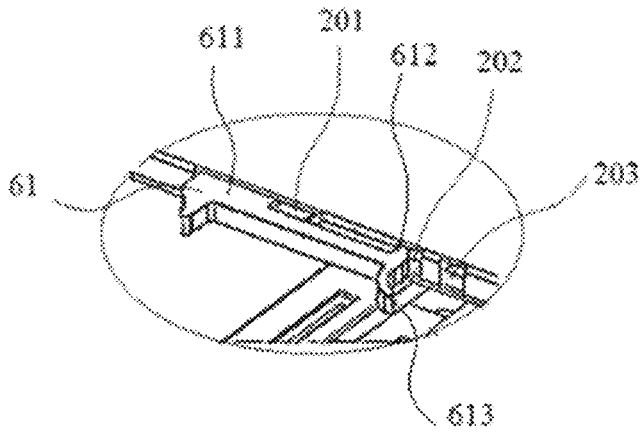
FIG. 9 is an enlarged view of a first transfer switch according to the present application.
Figure 10:
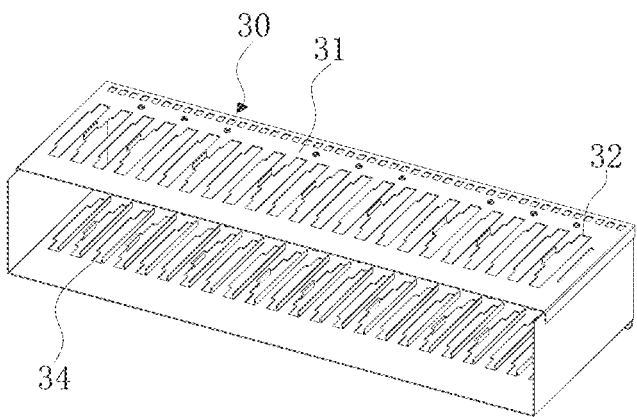
FIG. 10 is a schematic structural diagram of a hard disk frame according to the present application.
Figure 11:
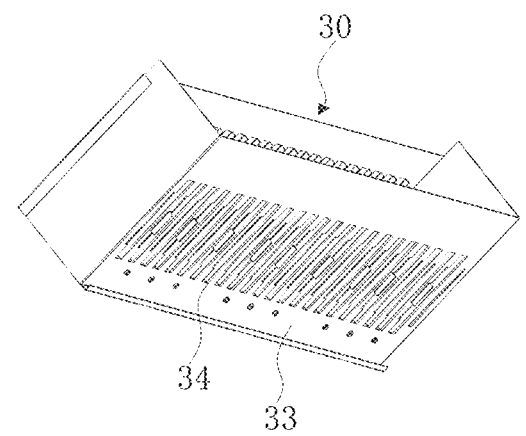
FIG. 11 is a schematic structural diagram of the hard disk frame at another angle according to the present application.

Further, as shown in FIG. 9, the end face of the cover plate 200 is provided with a first groove 201, a second groove 202, and a third groove 203. The first groove 201, the second groove 202, and the third groove 203 are arranged in parallel. An interval between the second groove 202 and the third groove 203 is smaller than that between the first groove 201 and the second groove 202. The first transfer switch 61 is provided with a first surface, a first protrusion 611 is arranged at a first end of the first surface of the first transfer switch 61, and a second protrusion 612 is arranged at a second end of the first surface of the first transfer switch 61. The first protrusion 611 is arranged in the first groove 201 and can slide along the first groove 201. The first protrusion 611 is connected to the first moving plate 10, while the second protrusion 612 is connected to the second groove 202 or the third groove 203 in a clamping manner.

A bottom surface of the cover plate 200 is provided with the first groove 201, the second groove 202, and the third groove 203, and one end of each of the first groove 201, the second groove 202, and the third groove 203 extends to the end face of the cover plate 200. A width of the first groove 201 accommodates the stroke of the first moving plate 10. The first protrusion 611 is positioned in the first groove 201, and when the first transfer switch 61 is pushed, the first protrusion 611 slides along the first groove 201 and drives the first moving plate 10 to move. The second groove 202 and the third groove 203 are configured to fix the second protrusion 612 of the first transfer switch 61. When the first transfer switch 61 is stationary, the second protrusion 612 is connected to the second groove 202 in a clamping manner. When the first protrusion 611 slides along the first groove 201, the second protrusion 612 may be connected to the third groove 203 in a clamping manner. At this point, the first boss 11 of the first moving plate 10 and the second boss 211 of the first adjustment plate 21 are stacked, and the pair of first supporting legs 212 of the first adjustment plate 21 extend into the hard disk frame 30.

Further, as shown in FIG. 9, in some embodiments of the present application, the first transfer switch 61 is provided with a second surface which is opposite to the first surface; the second surface is provided with a third protrusion 613 which is arranged opposite to the second protrusion 612; and when the third protrusion 613 is pressed, the second protrusion 612 is separated from the second groove 202 or the third groove 203.

When the third protrusion 613 is pressed, the second protrusion 612 is separated from the second groove 202 or the third groove 203, whereby the first transfer switch 61 is pushed to drive the first protrusion 611 to slide along the first groove 201 and then adjust the position of the first moving plate 10.

Correspondingly, the server cabinet further includes a second transfer switch 62 which is arranged on an end face of the hard disk frame 30. The second transfer switch 62 is connected to the hard disk frame 30 in a sliding way and is connected to the second moving plate 40.

The second transfer switch 62 is arranged on a lower end face of the hard disk frame 30 and is connected to the second moving plate 40. When the second transfer switch 62 is pushed to slide along the hard disk frame 30, the second moving plate 40 is driven to move, and then presses the second adjustment plate 51 to force the pair of second supporting legs 512 of the second adjustment plate 51 to extend into the hard disk frame 30.

Figure 12:
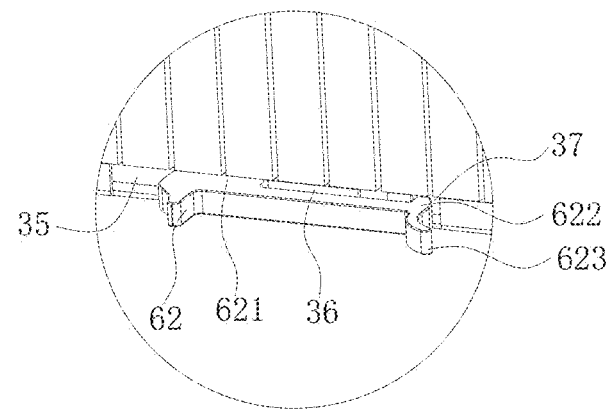
FIG. 12 is an enlarged view of a second transfer switch according to the present application.
Figure 13:
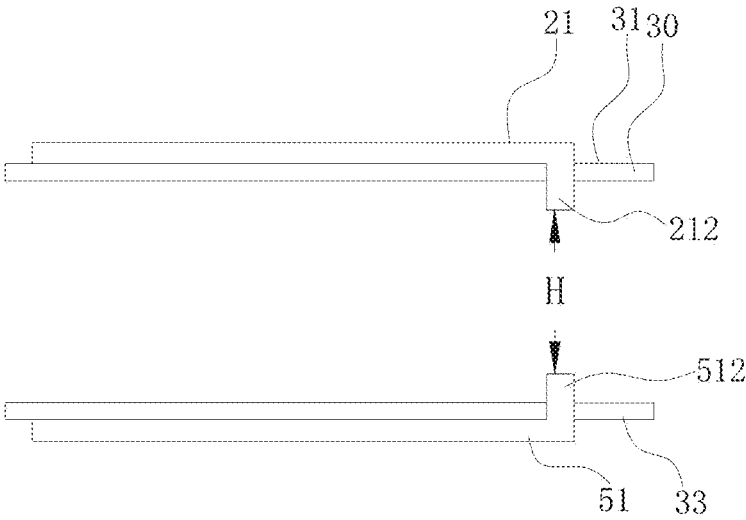
FIG. 13 is a schematic structural diagram of a part of a hard disk frame according to the present application.
Figure 14:
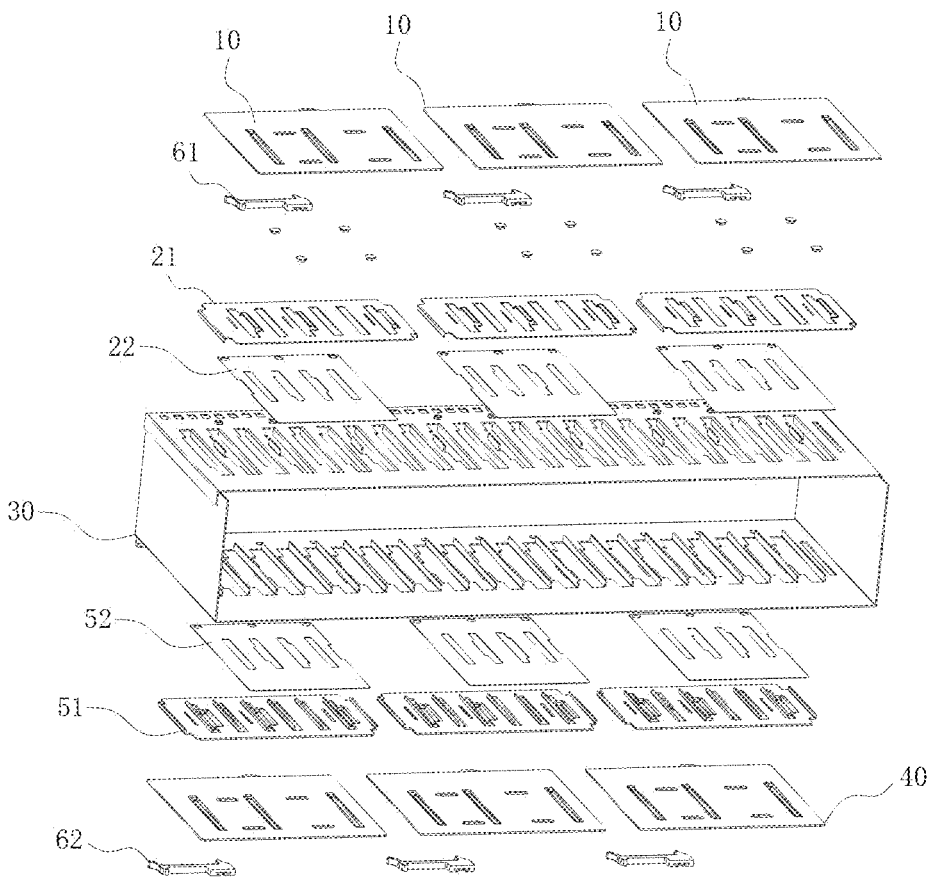
FIG. 14 is an explosive view of a part of a server cabinet according to the present application.

Further, as shown in FIG. 12, a bottom surface of the hard disk frame 30 is provided with a fourth groove 35, a fifth groove 36, and a sixth groove 37. The fourth groove 35, the fifth groove 36, and the sixth groove 37 are arranged in parallel. An interval between the fourth groove 35 and the fifth groove 36 is larger than that between the fifth groove 36 and the sixth groove 37. A width of the fourth groove 35 accommodates the stroke of the second moving plate 40. The second transfer switch 62 is provided with a first surface, a first end of the first surface of the second transfer switch 62 is provided with a fourth protrusion 621 of the second transfer switch 62 and a second end of the first surface of the second transfer switch 62 is provided with a fifth protrusion 622; the fourth protrusion 621 is positioned in the fourth groove 35 and can slide along the fourth groove 35; and the fifth protrusion 622 is connected to the fifth groove 36 or the sixth groove 37 in a clamping manner.

When the second transfer switch 62 is stationary, the fifth protrusion 622 is connected to the fifth groove 36 in a clamping manner. When the fourth protrusion 621 slides along the fourth groove 35, the fifth protrusion 622 is connected to the sixth groove in a clamping manner. At this point, the third boss 41 of the second moving plate 40 and the fourth boss 511 of the second adjustment plate 51 are stacked, and the pair of second supporting legs 512 of the second adjustment plate 51 extend into the hard disk frame 30.

Further, the second transfer switch 62 is further provided with a second surface which is opposite to the first surface of the second transfer switch 62; the second surface of the second transfer switch 62 is provided with a sixth protrusion 623 which is arranged opposite to the fifth protrusion 622; and when the sixth protrusion 623 is pressed, the fifth protrusion 622 is separated from the fifth groove 36 or the sixth groove 37.

A structure of the second transfer switch 62 is identical to that of the first transfer switch 61. When the sixth protrusion is pressed, the fifth protrusion 622 is separated from the fifth groove 36 or the sixth groove 37, whereby the second transfer switch 62 is pushed to force the fourth protrusion 621 to slide along the fourth groove 35 and then adjust the position of the second moving plate 20.

Some embodiments of the present application further provide a server which includes a server cabinet.

A hard disk and a mainboard are arranged in the server cabinet. The server cabinet includes a base 100, a first moving plate 10, a first adjustment assembly, a hard disk frame 30, and a cover plate 200. The base 100 includes a bottom plate 110 and two side plates 120 arranged on two sides of the bottom plate 110. The hard disk frame 30 is arranged in the base 100 and is provided with a first surface that faces away from the bottom plate 110, and a pair of first through holes are formed in the first surface. The first adjustment assembly is provided with a pair of first supporting legs 212, and each of the first supporting legs 212 is positioned above one of the first through holes. The first moving plate 10 is stacked above the first adjustment assembly and can slide along the first adjustment assembly. The cover plate 200 is stacked above the first moving plate 10 and connected to the two side plates of the base 100. When sliding along the first adjustment assembly, the first moving plate 10 presses the first adjustment assembly, and forces the first supporting legs 212 of the first adjustment assembly to penetrate the first through holes 32 and extend into the hard disk frame 30 to reduce a height H in the hard disk frame 30.

The base 100 includes the bottom plate 110 and the two side plates 120 arranged on the two sides of the bottom plate 110. The bottom plate 110 and the two side plates 120 form a U-shaped slot structure. The hard disk frame 30, the first adjustment assembly, and the first moving plate 10 are stacked in the U-shaped slot structure. The cover plate 200 is stacked above the first moving plate 10 and connected to the two side plates of the base 100. The first moving plate 10 is pushed from the front of the base 100 to slide along the first adjustment assembly, the first moving plate 10 can apply a pressing force to the first adjustment assembly, whereby the first supporting legs 212 of the first adjustment assembly penetrate the first through holes and extend into the hard disk frame 30 to reduce the height H in the hard disk frame 30 and allow for installation of thinner hard disks.

Further, in some embodiments, when the first moving plate 10 is stationary, the first supporting legs 212 of the first adjustment assembly are positioned above the first through holes of the hard disk frame 30. In some embodiments, the first adjustment assembly may be provided with an elastic member, and the elastic member is arranged on the first surface of the hard disk frame 30 and is positioned between the pair of first supporting legs 212 of the first adjustment assembly. When the first moving plate 10 does not apply a force to the first adjustment assembly, the elastic member supports the first adjustment assembly, thereby preventing the first supporting legs 212 from penetrating the first through holes. When the first moving plate 10 applies a force to the first adjustment assembly, the elastic member is compressed, and the first supporting legs 212 penetrate the first through holes and extend into the hard disk frame 30.

In some embodiments of the present application, cross-shaped holes are formed in the first surface of the hard disk frame 30 and serve as the first through holes. When the first moving plate 10 does not apply a force to the first adjustment assembly, the cross-shaped holes support the first adjustment assembly. When the first moving plate 10 applies a force to the first adjustment assembly, the cross-shaped holes are insufficient to support the first adjustment assembly, and the first supporting legs 212 of the first adjustment assembly penetrate the cross-shaped holes and extend into the hard disk frame 30 to reduce the height H in the hard disk frame 30.

Further, in some embodiments, the first moving plate 10 may be provided with a first boss 11, and the first adjustment assembly may be provided with a second boss 211. When the first moving plate 10 is stationary, the first boss 11 and the second boss 211 are arranged opposite to each other laterally, and at this point, the first moving plate 10 does not apply a force to the first adjustment assembly. When the first moving plate 10 moves, the first boss 11 moves toward the second boss 211 and finally slides over the second boss 211.

Finally, the first moving plate 10 presses the first adjustment assembly and forces the first supporting legs 212 of the first adjustment assembly to penetrate the first through holes 32 and extend into the hard disk frame 30.

As shown in FIG. 3 and FIG. 5, in some embodiments of the present application, a surface of the first moving plate 10 that faces the first adjustment assembly is provided with a first boss 11, a surface of the first adjustment assembly that faces the first moving plate 10 is provided with a second boss 211, the first boss 11 is provided with a first inclined surface, the second boss 211 is provided with a second inclined surface, and the first inclined surface and the second inclined surface slide in a matching manner. The first boss 11 has two positions: when the first boss 11 is at a first position of the two positions, the first inclined surface of the first boss 11 and the second inclined surface of the second boss 211 are arranged opposite to each other, and when the first boss 11 is at a second position of the two positions, the first boss 11 and the second boss 211 are stacked to press the first adjustment assembly.

As shown in FIG. 3, when the first moving plate 10 is stationary, the first inclined surface of the first boss 11 and the second inclined surface of the second boss 211 are arranged opposite to each other, and the first moving plate 10 is rested on the second boss 211. At this point, the first moving plate 10 does not apply a force to the first adjustment assembly, and the first supporting legs 212 of the first adjustment assembly are positioned above the first through holes. As shown in FIG. 5, when the first moving plate 10 moves, the first inclined surface of the first boss 11 is abut against the second inclined surface of the second boss 211. The first inclined surface of the first boss 11 and the second inclined surface of the second boss 211 slide in a matching manner to force the first boss 11 to slide onto a top surface of the second boss 211. At this point, the first boss 11 applies a pressing force to the second boss 211. Therefore, the first supporting legs 212 of the first adjustment assembly penetrate the first through holes and extend into the hard disk frame 30 to reduce the height H in the hard disk frame 30.

In some embodiments of the present application, the first adjustment assembly includes a first adjustment plate 21 and a first elastic member 22. A first surface of the first adjustment plate 21 that faces the hard disk frame 30 is provided with the pair of first supporting legs 212 and a second surface of the first adjustment plate 21 that faces the first moving plate 10 is provided with the second boss 211. The first elastic member 22 is stacked above the first surface 31 of the hard disk frame 30 and is positioned between the pair of first supporting legs 212. When the first boss 11 is at the first position, the first elastic member 22 is in a first compressed state; and when the first boss 11 is at the second position, the first elastic member 22 is in a second compressed state.

The first elastic member 22 is positioned between the pair of first supporting legs 212 of the first adjustment plate 21. When the first moving plate 10 is stationary, the first inclined surface of the first boss 11 and the second inclined surface of the second boss 211 are arranged opposite to each other, and the first elastic member 22 is in an first compressed state. The first elastic member 22 provides a supporting force for the first adjustment plate 21, thereby keeping the pair of first supporting legs 212 of the first adjustment plate 21 above the first through holes. Upon movement of the first moving plate 10, when the first boss 11 slides over the second boss 211, the first boss 11 presses the first adjustment plate 21, and then the first adjustment plate 21 presses the first elastic member 22 positioned below the first adjustment plate 21.

Consequently, the first elastic member 22 is in a second compressed state, and at this point, the pair of first supporting legs 212 of the first adjustment plate 21 penetrate the first through holes and extend into the hard disk frame 30 to reduce the height H in the hard disk frame 30.

Correspondingly, in some embodiments of the present application, a second adjustment assembly and a second moving plate 40 may also be arranged on the other side of the hard disk frame 30. When extending into the hard disk frame 30, second supporting legs 512 of the second adjustment assembly can cooperate with the first supporting legs 212 to further reduce the height H in the hard disk frame 30 and allow for installation of thinner hard disks in the hard disk frame 30.

The server cabinet further includes a second adjustment assembly and a second moving plate 40. The second adjustment assembly is provided with a pair of second supporting legs 512. The hard disk frame 30 is further provided with a second surface 33, which is opposite to the first surface 31 of the hard disk frame 30. A pair of second through holes 34 are formed in the second surface 33 of hard disk frame 30, and each of the second supporting legs 512 is positioned below one of the second through holes. The second moving plate 40 is stacked below the second adjustment assembly and is in contact with the bottom plate 110 of the base 100. The second moving plate 40 can slide along the second adjustment assembly. When sliding along the second adjustment assembly, the second moving plate 40 presses the second adjustment assembly and forces the second supporting legs 512 of the second adjustment assembly to penetrate the second through holes 34 and extend into the hard disk frame 30 to reduce the height H in the hard disk frame 30.

In some embodiments, the second moving plate 40 is positioned above the bottom plate 110 of the base 100, and the second adjustment assembly is stacked above the second moving plate and is in contact with the second surface 33 of the hard disk frame 30, namely, the second adjustment assembly and the second moving plate 40 are positioned below the hard disk frame 30. When the second moving plate 40 is stationary, the second supporting legs 512 of the second adjustment assembly are positioned below the second through holes and do not extend into the hard disk frame 30. When the second moving plate 40 moves, the second moving plate 40 presses the second adjustment assembly and forces the second supporting legs 512 to penetrate the second through holes 34 and extend into the hard disk frame 30. A space between the first supporting legs 212 and the second supporting legs 512 forms an installation space for the hard disk, thereby allowing for installation of thinner hard disks.

Further, in some embodiments of the present application, a first surface of the second moving plate 40 that faces the second adjustment assembly is provided with a third boss 41, a second surface of the second adjustment assembly that faces the second moving plate 40 is provided with a fourth boss 511, the third boss 41 is provided with a third inclined surface, the fourth boss 511 is provided with a fourth inclined surface, and the third inclined surface and the fourth inclined surface slide in a matching manner. The third boss 41 has two positions: when the third boss 41 is at a third position of the two positions, the third inclined surface of the third boss 41 and the fourth inclined surface of the fourth boss 511 are arranged opposite to each other, and when the third boss 41 is at a fourth position of the two positions, the third boss 41 and the fourth boss 511 are stacked to press the second adjustment assembly.

As shown in FIG. 6, when the second moving plate 40 is stationary, the third inclined surface of the third boss 41 and the fourth inclined surface of the fourth boss 511 are arranged opposite to each other, and the second moving plate 40 is rested on the fourth boss 511. At this point, the second moving plate 40 does not apply a force to the second adjustment assembly, and the second supporting legs 512 of the second adjustment assembly are positioned below the second through holes. As shown in FIG. 8, when the second moving plate 40 moves, the third inclined surface of the third boss 41 is abut against the fourth inclined surface of the fourth boss 511. The third inclined surface of the third boss 41 and the fourth inclined surface of the fourth boss 511 slide in a matching manner to force the third boss 41 to slide below a bottom surface of the fourth boss 511. At this point, the third boss 41 applies a pressing force to the fourth boss 511. Therefore, the second supporting legs 512 of the second adjustment assembly penetrate the second through holes and extend into the hard disk frame 30 to reduce the height H in the hard disk frame 30.

As shown in FIG. 6 and FIG. 8, in some embodiments of the present application, the second adjustment assembly includes a second adjustment plate 51 and a second elastic member 52. A first surface of the second adjustment plate 51 that faces the hard disk frame 30 is provided with the pair of second supporting legs 512 and a second surface of the second adjustment plate 51 that faces the second moving plate 40 is provided with the fourth boss 511. The second elastic member 52 is stacked below the second surface 33 of the hard disk frame 30 and positioned between the pair of second supporting legs 512. When the third boss 41 is at the third position, the second elastic member 52 is in a first compressed state, and when the third boss 41 is at the fourth position, the second elastic member 52 is in a second compressed state.

The second elastic member 52 is positioned between the pair of second supporting legs 512 of the second adjustment plate 51. When the second moving plate 40 is stationary, the third boss 41 and the fourth boss 511 are arranged opposite to each other, and the second elastic member 52 is in a first compressed state. The second elastic member 52 jacks up the second adjustment plate 51, thereby keeping the pair of second supporting legs 512 of the second adjustment plate 51 below the second through holes. Upon movement of the second moving plate 40, when the third boss 41 slides over the fourth boss 511, the third boss 41 presses the second adjustment plate 51, and then the second adjustment plate 51 presses the second elastic member 52 positioned above the second adjustment plate 51. Consequently, the second elastic member 52 is in a second compressed state, and at this point, the pair of second supporting legs 512 of the second adjustment plate 51 penetrate the second through holes and extend into the hard disk frame 30 to reduce the height H in the hard disk frame 30.

According to the server provided by some embodiments of the present application, by arranging the server cabinet, an installation height of hard disks in the server cabinet can be adjusted, whereby hard disks of various thicknesses can be installed in the server, the applicability of the server is improved, and functionality of the server is enhanced.

Finally, it should be noted that: the above-mentioned embodiments are merely illustrative of the technical solutions of the present application, and do not limit same; while the present application has been described in detail with reference to the foregoing embodiments, those of ordinary skill in the art will appreciate that: the technical solutions disclosed in the above-mentioned embodiments can still be modified or some of the technical features can be replaced by equivalents; however, these modifications or substitutions do not depart from the spirit and scope of the technical solutions of the embodiments of the present application in nature.

What is claimed is:

1. A server cabinet, comprising:

a base, wherein the base comprises a bottom plate;

a hard disk frame arranged in the base, wherein the hard disk frame is provided with a first surface that faces away from the bottom plate, and a first through hole is formed in the first surface;

a first adjustment assembly, wherein the first adjustment assembly is provided with a first supporting leg, and the first supporting leg is positioned above the first through hole; and a first moving plate, wherein the first moving plate is stacked above the first adjustment assembly and is capable of sliding along the first adjustment assembly, wherein the first moving plate presses the first adjustment assembly during sliding along the first adjustment assembly, and forces the first supporting leg of the first adjustment assembly to penetrate the first through hole and extend into the hard disk frame to reduce a height in the hard disk frame.

2. The server cabinet according to claim 1, wherein the first adjustment assembly is provided with a pair of the first supporting legs, a surface of the first moving plate that faces the first adjustment assembly is provided with a first boss, a surface of the first adjustment assembly that faces the first moving plate is provided with a second boss, the first boss is provided with a first inclined surface, the second boss is provided with a second inclined surface, and the first inclined surface and the second inclined surface slide in a matching manner; and the first boss has two positions: under a condition that the first boss is at a first position of the two positions, the first inclined surface of the first boss and the second inclined surface of the second boss are arranged opposite to each other, and under a condition that the first boss is at a second position of the two positions, the first boss and the second boss are stacked to press the first adjustment assembly.

3. The server cabinet according to claim 2, wherein the first adjustment assembly comprises:

a first adjustment plate, wherein a first surface of the first adjustment plate that faces the hard disk frame is provided with the pair of the first supporting legs and a second surface of the first adjustment plate that faces the first moving plate is provided with the second boss; and a first elastic member, wherein the first elastic member is stacked above the first surface of the hard disk frame and positioned between the pair of the first supporting legs, wherein under the condition that the first boss is at the first position of the two positions, the first elastic member is in a first compressed state, and under the condition that the first boss is at the second position of the two positions, the first elastic member is in a second compressed state.

4. The server cabinet according to claim 2, wherein the first adjustment assembly comprises a first adjustment plate, wherein a first surface of the first adjustment plate that faces the hard disk frame is provided with the pair of the first supporting legs and a second surface of the first adjustment plate that faces the first moving plate is provided with the second boss; and the first through hole is cross-shaped hole.

5. The server cabinet according to claim 1, further comprising:

a second adjustment assembly, wherein the second adjustment assembly is provided with a pair of second supporting legs, the hard disk frame is further provided with a second surface, the second surface of the hard disk frame is opposite to the first surface of the hard disk frame, a pair of second through holes are formed in the second surface of the hard disk frame, and each of the second supporting legs is positioned below one of the second through holes; and a second moving plate, wherein the second moving plate is stacked below the second adjustment assembly, is in contact with the bottom plate of the base, and is capable of sliding along the second adjustment assembly, wherein the second moving plate presses the second adjustment assembly during sliding along the second adjustment assembly, and forces the second supporting legs of the second adjustment assembly to penetrate the second through holes and extend into the hard disk frame to reduce the height in the hard disk frame.

6. The server cabinet according to claim 5, wherein a first surface of the second moving plate that faces the second adjustment assembly is provided with a third boss, a second surface of the second adjustment assembly that faces the second moving plate is provided with a fourth boss, the third boss is provided with a third inclined surface, the fourth boss is provided with a fourth inclined surface, and the third inclined surface and the fourth inclined surface slide in a matching manner; and the third boss has two positions: under a condition that the third boss is at a third position of the two positions, the third inclined surface of the third boss and the fourth inclined surface of the fourth boss are arranged opposite to each other, and under a condition that the third boss is at a fourth position of the two positions, the third boss and the fourth boss are stacked to press the second adjustment assembly.

7. The server cabinet according to claim 6, wherein the second adjustment assembly comprises:

a second adjustment plate, wherein a first surface of the second adjustment plate that faces the hard disk frame is provided with the pair of second supporting legs and a second surface of the second adjustment plate that faces the second moving plate is provided with the fourth boss; and a second elastic member, wherein the second elastic member is stacked below the second surface of the hard disk frame and positioned between the pair of second supporting legs, wherein under the condition that the third boss is at the third position, the second elastic member is in a first compressed state, and under the condition that the third boss is at the fourth position, the second elastic member is in a second compressed state.

8. The server cabinet according to claim 6, wherein the second adjustment assembly comprises a second adjustment plate, wherein a first surface of the second adjustment plate that faces the hard disk frame is provided with the pair of second supporting legs and a second surface of the second adjustment plate that faces the second moving plate is provided with the fourth boss; and the second through holes are cross-shaped holes.

9. The server cabinet according to claim 5, wherein the first moving plate and the first adjustment assembly form a first adjustment mechanism; the second moving plate and the second adjustment assembly form a second adjustment mechanism; and multiple first adjustment mechanisms and multiple second adjustment mechanisms are arranged, and each of the multiple first adjustment mechanisms is positioned opposite to one of the multiple second adjustment mechanisms.

10. The server cabinet according to claim 9, wherein each of at least one of the multiple first adjustment mechanisms or the multiple second adjustment mechanisms is configured to adjust a height of a relative position in the hard disk frame.

11. The server cabinet according to claim 1, wherein further comprising:

a cover plate, wherein the cover plate is stacked above the first moving plate and connected to two side plates of the base; and a first transfer switch, wherein the first transfer switch is arranged on an end face of the cover plate, is connected to the cover plate in a sliding way, and is connected to the first moving plate.

12. The server cabinet according to claim 11, wherein the end face of the cover plate is provided with a first groove, a second groove, and a third groove, wherein the first groove, the second groove, and the third groove are arranged in parallel; and the first transfer switch is provided with a first surface, wherein a first end of the first surface of the first transfer switch is provided with a first protrusion and a second end of the first surface of the first transfer switch is provided with a second protrusion; the first protrusion is arranged in the first groove, is capable of sliding along the first groove, and is connected to the first moving plate; and the second protrusion is connected to the second groove or the third groove in a clamping manner.

13. The server cabinet according to claim 12, wherein the first transfer switch is further provided with a second surface, wherein the second surface of the first transfer switch is opposite to the first surface of the first transfer switch; the second surface of the first transfer switch is provided with a third protrusion; the third protrusion and the second protrusion are arranged opposite to each other; and under a condition that the third protrusion is pressed, the second protrusion is separated from the second groove or the third groove.

14. The server cabinet according to claim 5, wherein further comprising a second transfer switch, wherein the second transfer switch is arranged on an end face of the hard disk frame, is connected to the hard disk frame in a sliding way, and is connected to the second moving plate.

15. The server cabinet according to claim 14, wherein the end face of the hard disk frame is provided with a fourth groove, a fifth groove, and a sixth groove, wherein the fourth groove, the fifth groove, and the sixth groove are arranged in parallel; and the second transfer switch is provided with a first surface, wherein a first end of the first surface of the second transfer switch is provided with a fourth protrusion and a second end of the first surface of the second transfer switch is provided with a fifth protrusion; the fourth protrusion is arranged in the fourth groove, is capable of sliding along the fourth groove, and is connected to the second moving plate; and the fifth protrusion is connected to the fifth groove or the sixth groove in a clamping manner.

16. The server cabinet according to claim 15, wherein the second transfer switch is provided with a second surface, wherein the second surface of the second transfer switch is opposite to the first surface of the second transfer switch; the second surface of the second transfer switch is provided with a sixth protrusion; the sixth protrusion and the fifth protrusion are arranged opposite to each other; and under a condition that the sixth protrusion is pressed, the fifth protrusion is separated from the fifth groove or the sixth groove.

17. The server cabinet according to claim 5, wherein the base comprises two side plates, and the bottom plate and the two side plates of the base form a U-shaped slot structure.

18. The server cabinet according to claim 5, wherein the first adjustment assembly is provided with a pair of the first supporting legs and a space between the first supporting legs and the second supporting legs is configured to install a hard disk.

19. A server, comprising a server cabinet, wherein the server cabinet comprises:

a base, wherein the base comprises a bottom plate;

a hard disk frame arranged in the base, wherein the hard disk frame is provided with a first surface that faces away from the bottom plate, and a first through hole is formed in the first surface;

a first adjustment assembly, wherein the first adjustment assembly is provided with a first supporting leg, and the first supporting leg is positioned above the first through hole; and a first moving plate, wherein the first moving plate is stacked above the first adjustment assembly and is capable of sliding along the first adjustment assembly, wherein the first moving plate presses the first adjustment assembly during sliding along the first adjustment assembly, and forces the first supporting leg of the first adjustment assembly to penetrate the first through hole and extend into the hard disk frame to reduce a height in the hard disk frame.

20. A server cabinet, comprising:

a base, wherein the base comprises a bottom plate and two side plates arranged on at least one side of the bottom plate;

a hard disk frame arranged in the base, wherein the hard disk frame is provided with a first surface that faces away from the bottom plate, and a pair of first through holes are formed in the first surface;

a first adjustment assembly, wherein the first adjustment assembly is provided with a pair of first supporting legs, and each of the first supporting legs is positioned above one of the first through holes;

a first moving plate, wherein the first moving plate is stacked above the first adjustment assembly and is capable of sliding along the first adjustment assembly; and a cover plate, wherein the cover plate is stacked above the first moving plate and connected to the two side plates of the base, wherein the first moving plate presses the first adjustment assembly during sliding along the first adjustment assembly, and forces the first supporting legs of the first adjustment assembly to penetrate the first through holes and extend into the hard disk frame to reduce a height in the hard disk frame.

* * * * *